United States Patent [19]

Kato

[11] Patent Number: 5,554,888
[45] Date of Patent: Sep. 10, 1996

[54] SEMICONDUCTOR DEVICE WIRING STRUCTURE

[75] Inventor: Katsuyuki Kato, Kanagawa, Japan

[73] Assignee: Sony Corporation, Tokyo, Japan

[21] Appl. No.: 233,997

[22] Filed: Apr. 28, 1994

[30] Foreign Application Priority Data

Apr. 30, 1993 [JP] Japan .................................. 5-104766

[51] Int. Cl.$^6$ ........................... H01L 23/48; H01L 23/52; H01L 29/40
[52] U.S. Cl. ......................................... 257/750; 257/754
[58] Field of Search .................................. 257/750, 765, 257/768, 751, 767, 754, 771, 763, 770

[56] References Cited

U.S. PATENT DOCUMENTS

| | | | |
|---|---|---|---|
| 4,087,314 | 5/1978 | George et al. ........................... | 257/750 |
| 5,132,775 | 7/1992 | Bighton et al. .......................... | 257/750 |

*Primary Examiner*—Sara W. Crane
*Assistant Examiner*—S. V. Clark

*Attorney, Agent, or Firm*—Hill, Steadman & Simpson

[57] ABSTRACT

A semiconductor device of a multilayer wiring structure provided with a bottom conductive layer and a top conductive layer connected through a pillar connection portion, wherein the bottom conductive layer has a pattern determined by the sum of the pattern of the auxiliary conductive layer formed on the bottom conductive layer and the pattern of the pillar connection portion. Also, a process for production of a semiconductor device including a step of forming a bottom conductive layer, a step of forming an auxiliary conductive layer on the bottom conductive layer, a step of patterning just the auxiliary conductive layer to obtain a first pattern of the auxiliary conductive layer, a step of forming a pillar conductive layer on the bottom conductive layer, a step of patterning the pillar conductive layer by a predetermined second pattern to obtain a second pattern of a pillar connection portion, and a step of etching the bottom conductive layer with etching masks of the second pattern of the pillar connection portion and the first pattern of the auxiliary conductive layer to pattern the bottom conductive layer by a pattern determined by the sum of the first pattern and the second pattern.

7 Claims, 8 Drawing Sheets

FIG. IA

(RELATED ART)

FIG. IB

(RELATED ART)

FIG. 2A

(RELATED ART)

FIG. 2B

(RELATED ART)

SEMICONDUCTOR DEVICE WIRING STRUCTURE

BACKGROUND OF THE INVENTION

1. Field of the Invention

The present invention relates to a semiconductor device multilayer wiring structure and to a process for production of the same, and, more particularly, the present invention relates to a semiconductor device multilayer wiring structure which is free from poor connections and the like and is high in reliability even when the contact portions are made finer and to a process for the production of the same.

2. Description of the Related Art

Along with the greater degree of integration of semiconductor devices, multiple layers for wiring are being laid on the surfaces of semiconductor substrates. Further, the increasing miniaturization of wiring has made the reliability of the wiring a problem. As a result, there is a demand for improved wiring reliability.

At the present time, the main method used in the contact burying technology for semiconductor devices of a multilayer wiring structure is the one in which a contact hole is formed in an interlayer insulating layer on a bottom conductive layer, then the contact hole is filled or buried with a top conductive layer, thereby connecting the bottom conductive layer and top conductive layer through the contact hole. When burying with the conductive layer, use is made of the high temperature bias sputtering method, the CVD method, the selective growth method, etc. This contact burying method has the advantage of a high reliability for the wiring connections.

Along with the increasing miniaturization of semiconductor devices, however, the contact holes have also become miniaturized and it is becoming difficult to stably bury the resultant finer contact holes.

Therefore, the method of pillar formation, which enables easy miniaturization of the contact portions, has been drawing attention. In the pillar formation method, before forming the interlayer insulating layer on the surface of the bottom conductive layer, a pillar connection portion (contact portion) is formed at a predetermined location of the surface of the bottom conductive layer, then the interlayer insulating layer is formed and then the etch back method or the like is used to selectively remove the interlayer insulating layer to expose only the top end of the pillar connection portion. Subsequent to this, the top conductive layer is formed on the interlayer insulating layer, then the top conductive layer and the bottom conductive layer are connected and wired through the pillar connection portion.

It is considered that with this pillar formation method, miniaturization of the pillar connection portion would be easier than with the method of burying fine contact holes.

The pillar formation method, however, has been considered difficult to commercially apply due to the complexity of the method of formation of the pillar connection portion itself, the difficulty in controlling the formation of the pillar connection portion (liftoff, selective growth, etc.), the strict demands on precision positioning of the bottom conductive layer and the pillar connection portion, and other reasons.

SUMMARY OF THE INVENTION

The present invention has as its object the provision of a semiconductor device of a multilayer wiring structure which enables formation of fine contacts and which is free from poor connections and the like and is high in connection reliability even when the contact portions are made finer and to a process for the production of the same.

To achieve the above object, the semiconductor device of a multilayer wiring structure of the present invention is provided with a bottom conductive layer and a top conductive layer connected through a pillar connection portion, wherein the bottom conductive layer has a pattern determined by the sum of the pattern of the auxiliary conductive layer formed on the bottom conductive layer and the pattern of the pillar connection portion.

Further, to achieve the above object, the process for production of the semiconductor device of the present invention comprises a step of forming the bottom conductive layer, a step of forming an auxiliary conductive layer on the bottom conductive layer, a step of patterning just the auxiliary conductive layer formed on the bottom conductive layer to form a first pattern of the auxiliary conductive layer, a step of forming a pillar conductive layer for forming a pillar connection portion on the bottom conductive layer on which the first pattern of the auxiliary conductive layer is formed, a step of patterning the pillar conductive layer by a predetermined second pattern corresponding to pattern of connection with a top conductive layer scheduled to be formed on the top of the same and thus forming a second pattern of a pillar connection portion, and a step of etching the bottom conductive layer with etching masks of the second pattern of the pillar connection portion and the first pattern of the auxiliary conductive layer to pattern the bottom conductive layer by a pattern determined by the sum of the first pattern and the second pattern and, preferably, a step of forming an interlayer insulating layer on the surface of the bottom conductive layer on which the pillar connection portion and the auxiliary conductive layer are formed after patterning the bottom conductive layer, a step of selectively removing the interlayer insulating layer so that the top surface of the pillar connection portion is exposed, and a step of forming a top conductive layer on the surface of the interlayer insulating layer and connecting the top conductive layer through the pillar connection portion to the bottom conductive layer.

The bottom conductive layer, the auxiliary conductive layer, and/or the pillar conductive layer may be comprised of two or more conductive layers.

The material of the bottom conductive layer and the material of the auxiliary conductive layer are preferably selected so that the speed of etching processing of the bottom conductive layer is slow under the conditions for patterning the auxiliary conductive layer and the speed of etching processing of the auxiliary conductive layer is slow under the conditions for patterning the bottom conductive layer.

The bottom conductive layer may be comprised of either an aluminum alloy or a copper alloy. The auxiliary conductive layer may be comprised of any of a high melting point metal, titanium nitride, titanium oxynitride, silicide, or laminated films of two or more of these.

The step of selectively removing the interlayer insulating film is preferably performed by polishing.

The auxiliary conductive layer may be comprised of a material functioning as a film for preventing reflectance at the time of exposure for patterning the bottom conductive layer.

Since the bottom conductive layer has a pattern determined by the sum of the pattern of the auxiliary conductive layer formed on it and the pattern of the pillar connection portion, even if the bottom conductive layer and the pillar connection portion (contact portion) are miniaturized, it is possible to determine the area of the connection portion by self-alignment and therefore possible to prevent poor connections and improve the connection reliability.

BRIEF DESCRIPTION OF THE DRAWINGS

These and further objects and features of the present invention will be more apparent from the following description of the related art and preferred embodiments given with reference to the appended drawings, wherein.

DESCRIPTION OF THE PREFERRED EMBODIMENTS

Before describing the preferred embodiments of the invention, a more detailed description will be given below, with reference to the drawings, of two examples of the related art as described above.

Figure 1A:
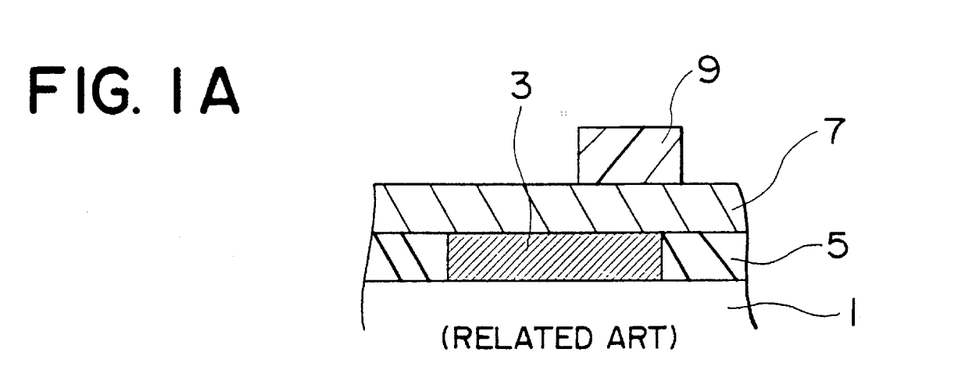
FIGS. 1A and 1B are sectional views of key portions showing a process for production of a semiconductor device of a multilayer wiring structure according to the related art.
Figure 1B:
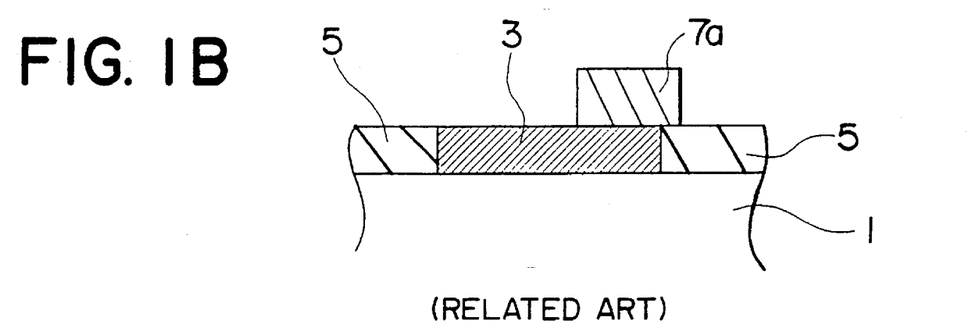

A pillar connection portion may be formed by the method of the related art shown in FIGS. 1A and 1B, for example. As shown in FIG. 1A, a bottom conductive layer 3 and an insulating layer 5 are formed on an underlying layer 1 comprised of the semiconductor substrate or interlayer insulating layer, a pillar conductive layer 7 is formed on the bottom conductive layer 3 and the insulating layer 5, and a resist 9 for forming the pillar connection portions is formed on top of that. After this, the resist 9 is used for patterning the pillar conductive layer 7 by etching etc. and obtain the pillar connection portion 7a shown in FIG. 1B.

Along with the increasing miniaturization of the bottom conductive layer 3 and the pillar connection portion 7a, however, pattern deviation between the pillar connection portion 7a and the bottom conductive layer 3 has become a problem and could lead to a reduction in the reliability of connections.

Figure 2A:
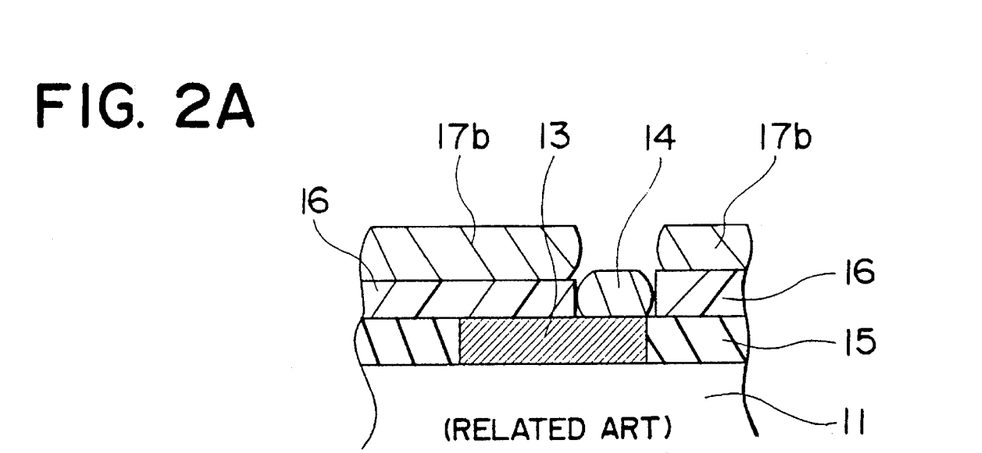
FIGS. 2A and 2B are sectional views of key portions showing a process for production of a semiconductor device of a multilayer wiring structure according to another related art device.
Figure 2B:
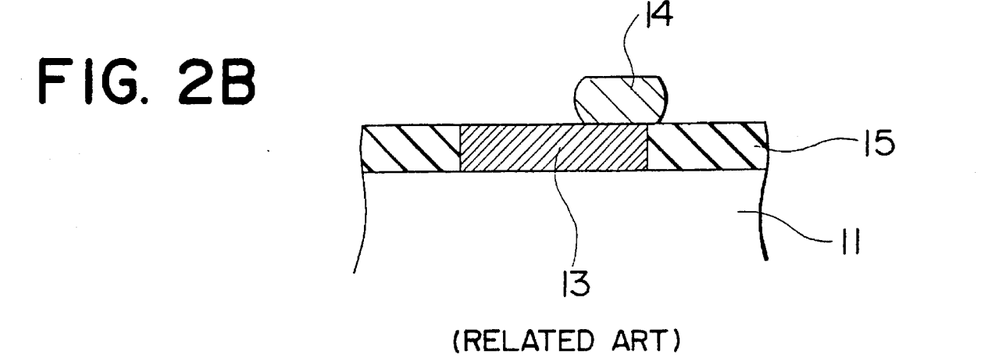

The liftoff method shown in FIGS. 2A and 2B is a known conventional method for forming a pillar. In this method, as shown in FIG. 2A, a bottom conductive layer 13 and insulating layer 15 are formed on an underlying layer 11, then a resist 16 is formed on the surface of the same, an opening for forming a pillar is formed in the resist 16, then the pillar formation conductive layers 14 and 17b are formed on the resist 16 with the opening. After this, as shown in FIG. 2B, only the pillar conductive layer 14 which had been buried in the opening of the resist 16 remains to form the pillar connection portion 14.

In this related art device, however, along with the increasing miniaturization of the bottom conductive layer 13 and the pillar connection portion 14, however, pattern deviation between the pillar connection portion 14 and the bottom conductive layer 13 has become a problem and could lead to a reduction in the reliability of connections.

Figure 3A:
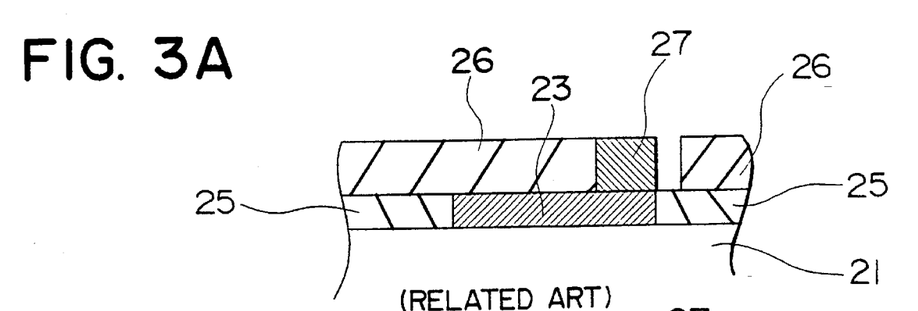
FIGS. 3A and 3B are sectional views of key portions showing a process for production of a semiconductor device of a multilayer wiring structure according to still another related art device.
Figure 3B:
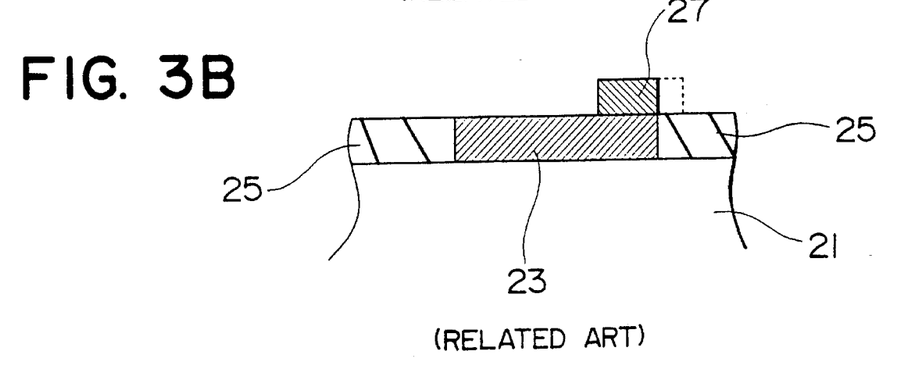

Further, the method of selective growth of a conductive pillar as shown in FIGS. 3A and 3B has been known as another conventional method for forming a pillar. In this method, as shown in FIG. 3A, a bottom conductive layer 23 and insulating layer 25 are formed on an underlying layer 21, then a resist 26 is formed on the surface of the same and an opening for forming a pillar is formed in the resist 26. After this, as shown in FIG. 3B, tungsten metal for example is selectively grown at the portion of the opening of the resist to form the pillar connection portion 27. With this selective growth of a metal, a selectively grown metal portion is formed only at a position corresponding to the surface portion of the underlying bottom conductive layer 23.

In this example of the related art, however, since a pillar connection portion 27 of the selectively grown method portion is formed only at a position corresponding to the surface portion of the underlying bottom conductive layer 23, along with the increasing miniaturization of the bottom conductive layer 23 and the pillar connection portion, pattern deviation between the opening portion of the resist 26 and the bottom conductive layer 23 has become a problem and could lead to a reduction in the reliability of connections.

Below, a semiconductor device of a multilayer wiring structure and a process for production of the same according to embodiments of the present invention will be explained with reference to the drawings.

FIGS. 4A to 4H and FIGS. 5E to 5H are sectional views of key portions showing a process for production of a semiconductor device according to an embodiment of the present invention; FIGS. 6E to 6H are schematic perspective views of key portions showing a process for production according to the same embodiment; and FIGS. 7A to 7D are sectional views of key portions showing a process for production after formation of the pillar connection portion on the bottom conductive layer and are sections along line VII—VII in FIG. 6H.

Figure 4A:
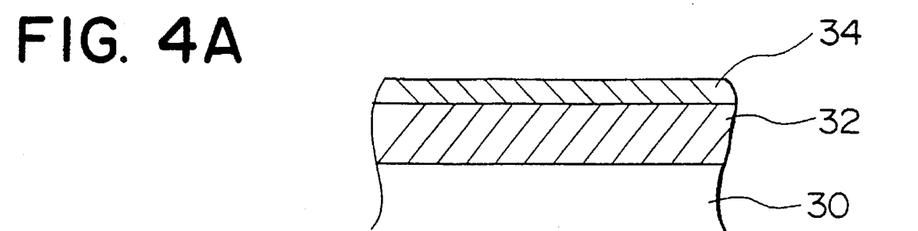
FIGS. 4A to 4H are sectional views of key portions showing a process for production of a semiconductor device according to an embodiment of the present invention.

As shown in FIG. 4A, in the process of production of a semiconductor device according to an embodiment of the present invention, a bottom conductive layer 32 is formed on an underlying layer 30 comprised of a semiconductor substrate, an interlayer insulating layer, or the like. At the bottom side of the underlying layer 30, one or more conductive layers may also be superimposed. The bottom conductive layer 32 is comprised of a conductive material, for example, an aluminum alloy (Al, Al-Si, Al-Si-Cu, Al-Cu, etc.), copper alloy, polycrystalline silicon, etc.

Next, in the embodiment, an auxiliary conductive layer 34 is formed on the bottom conductive layer 32. The auxiliary conductive layer 34 is comprised of a material which gives a slow etching processing speed of the bottom conductive layer 32 under the conditions of patterning the auxiliary conductive layer 34 and a slow etching processing speed of the auxiliary conductive layer 34 under conditions of patterning the bottom conductive layer 32, more specifically, is comprised of a high melting point metal (Mo, W, Ta, Ti, etc.), titanium nitride (TiN), titanium oxynitride (TiON), silicide ($MoSi_x$, $WSi_x$, $TiSi_x$, $PtSi_x$) or a film of two or more superimposed layers of the same (Ti/TiN/Ti, Ti/TiON/Ti), etc. In this embodiment, the auxiliary conductive layer 34 preferably is comprised of a material functioning as a film for preventing reflectance at the time of patterning the bottom conductive layer 32. This is because the patterning of the bottom conductive layer 32 becomes better. The thickness of the auxiliary conductive layer 34 is not particularly limited, but preferably is from about 50 to 100 nm.

Figure 4B:
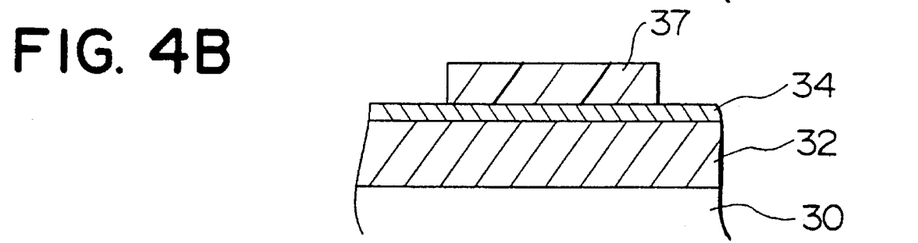
Figure 4C:
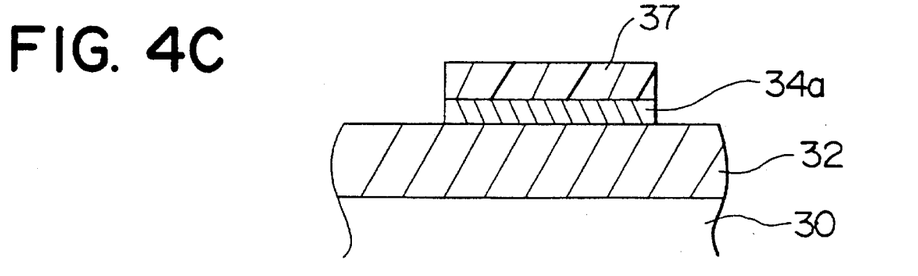

Next, in the present embodiment, as shown in FIG. 4B, a resist 37 is formed on the surface of the auxiliary conductive layer 34 and then this resist 37 is used to pattern the auxiliary conductive layer 34 by etching etc. to obtain the first pattern of the auxiliary conductive layer 34a as shown in FIG. 4C. The first pattern of the auxiliary conductive layer 34a, as mentioned later, is used as the mask for patterning the bottom conductive layer 32.

Figure 4D:
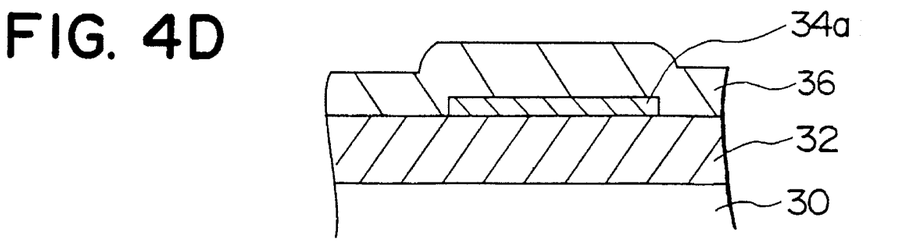

Next, in this embodiment, as shown in FIG. 4D, the resist 37 is removed and a pillar conductive layer 36 is formed on the surface of the first pattern of the auxiliary conductive layer 34a. The pillar conductive layer 36 is comprised of a material different from the auxiliary conductive layer 34a so that the auxiliary conductive layer 34a will not be processed much at all under the etching conditions when etching the conductive layer 36. The pillar conductive layer 36, the auxiliary conductive layer 34a, and the bottom conductive layer 32 preferably are all comprised of different materials.

Figure 4E:
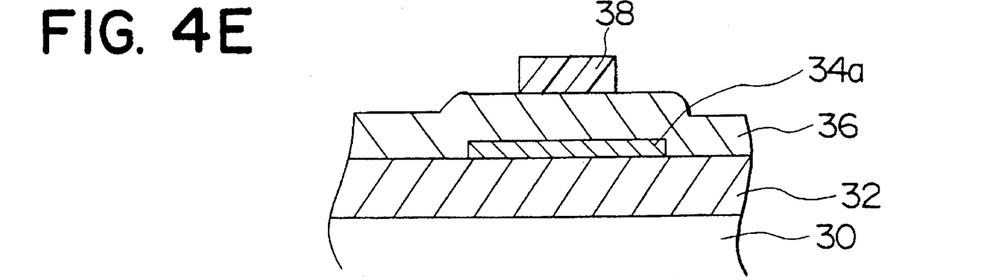
Figure 4F:
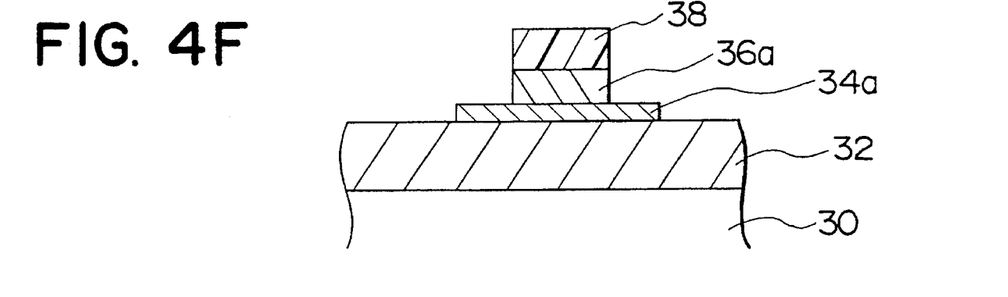

Next, in this embodiment, as shown in FIG. 4E, a resist 38 is formed on the surface of the pillar conductive layer 36, then this resist 38 is used as a mask to pattern the pillar conductive layer 36 by etching etc. to obtain the second pattern of the pillar connection portion 36a as shown in FIG. 4F. The second pattern is a pattern corresponding to the position where the contact is to be formed in the top conductive layer, not shown, for the bottom conductive layer 32.

Figure 4G:
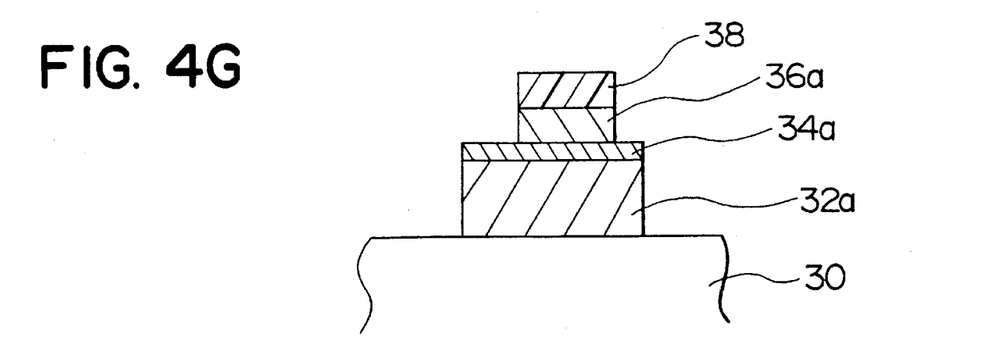

Next, in this embodiment, as shown in FIG. 4G, while leaving the resist 38, the first pattern of the auxiliary conductive layer 34a and the second pattern of the pillar connection portion 36a are used as a mask for etching and the bottom conductive layer 32 is etched. Therefore, it is possible to obtain a wiring pattern of the bottom conductive layer 32a as determined by the sum of the first pattern and the second pattern.

Figure 4H:
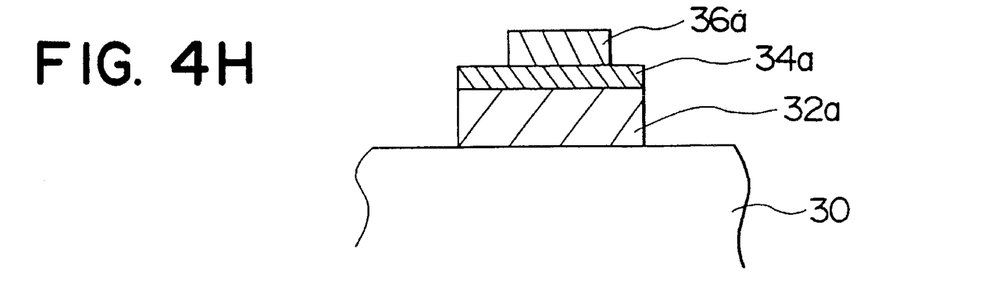

After this, as shown in FIG. 4H, by removing the resist 38, it is possible to easily obtain a structure of a pillar connection portion 36a on the bottom conductive layer 32a and thus there is no risk of a poor connection between the pillar connection portion 36a and the bottom conductive layer 32a.

Figure 5E:
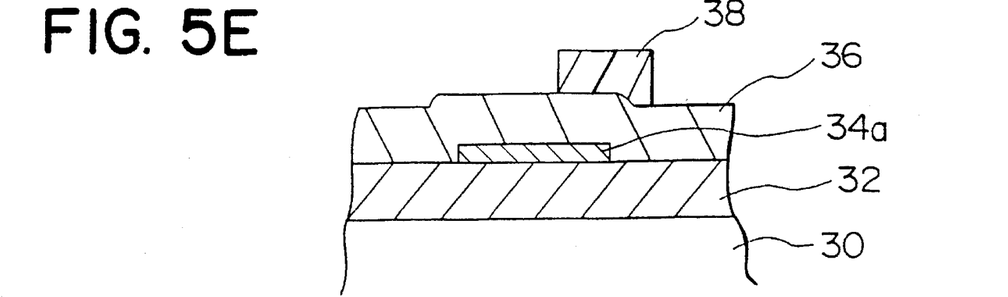
FIGS. 5E to 5H are another sectional views of key portions showing the process for production corresponding to FIGS. 4E to 5H.
Figures 5F, 5G:
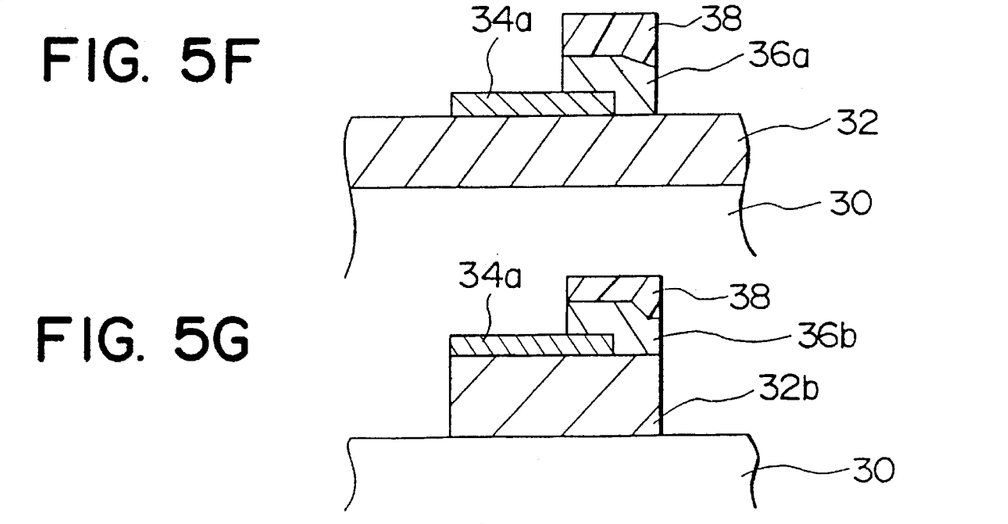
Figure 6E:
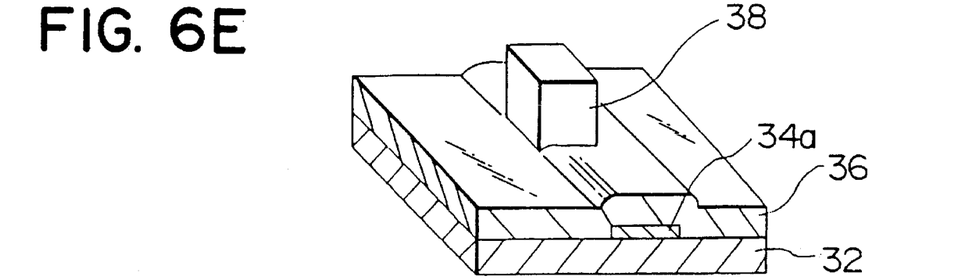
FIGS. 6E to 6H are schematic perspective views of key portions showing the process for production corresponding to FIGS. 5E to 5H.
Figure 6F:
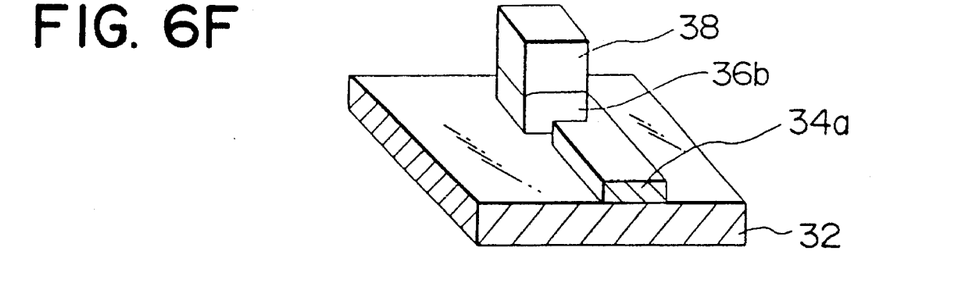

For example, as shown in FIG. 5E and FIG. 6E, even if the resist 38 for forming the pillar connection portion is formed off-position with respect to the first pattern of the auxiliary conductive layer 34a due to mask slipping etc., there is no reduction in the reliability of the connection between the pillar connection portion 36b and the bottom conductive layer 32b due to the reasons mentioned later.

Figure 6G:
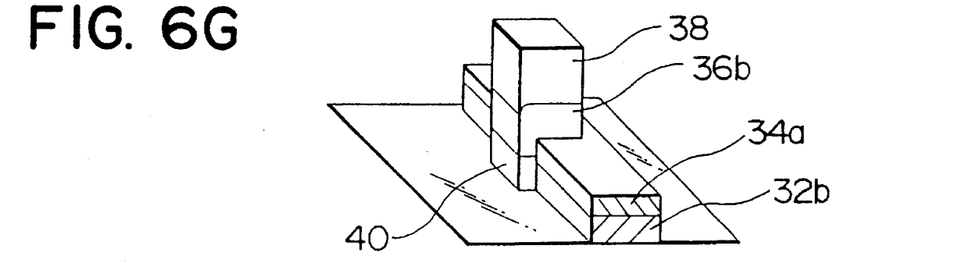

As shown in FIGS. 5E to 5F and FIGS. 6E to 6F, if the pillar conductive layer 36 is patterned by the resist 38, a second pattern of a pillar connection portion 36b slightly off in position with respect to the first pattern of auxiliary conductive layer 34a is obtained. After this, as shown in FIG. 5G and FIG. 6G, with the resist 38 left as is, the first pattern of the auxiliary conductive layer 34b and the second pattern of the pillar connection portion 36b are used as masks for etching and the bottom conductive layer 32 is etched, thereby enabling acquisition of a wiring pattern of the bottom conductive layer 32b determined by the sum of the first pattern and the second pattern.

Figure 5H:
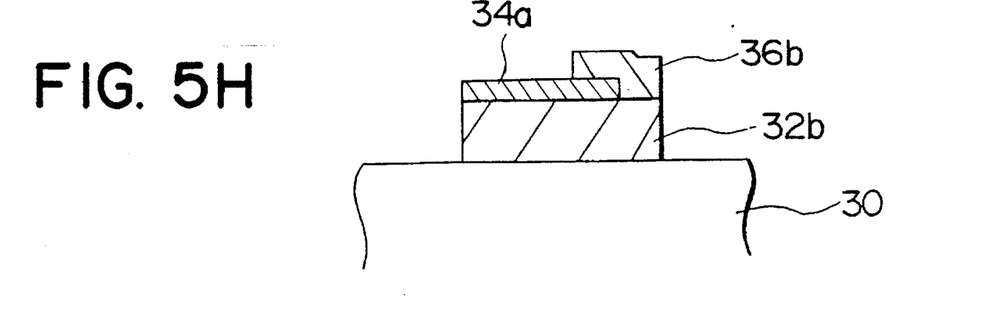
Figure 6H:
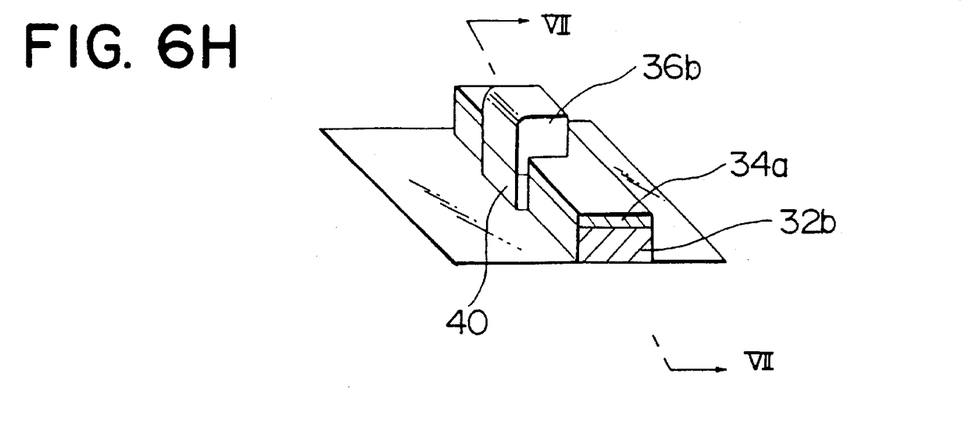

After this, as shown in FIG. 5H and FIG. 6H, by removing the resist 38, it is possible to easily obtain a structure of a pillar connection portion 36b on the bottom conductive layer 32b. In this case too, the area of connection between the pillar connection portion 36b and the bottom conductive layer 32b is not reduced and the reliability of the connection is improved. As shown in FIG. 6H, however, at the connection portion of the bottom conductive layer 32b and the pillar connection portion 36b, a thick wiring portion 40 is formed at the bottom conductive layer 32b. Therefore, in this embodiment, the wiring distance between the bottom conductive layers 32b has to be designed planning for a margin for mask misalignment "x" . As opposed to this, in the related art examples, the mask misalignment "x" was liable to occur at both sides of the bottom conductive layer, so it was necessary to increase the thickness of the wiring of the bottom conductive layer by a margin of "2x". Compared with the related art, therefore, it becomes possible to miniaturize by x (=2x–x) per bottom conductive layer.

Further, when the material comprising the pillar connection portion 36b ia a material requiring formation of a barrier with the bottom conductive layer 32b, since there is no auxiliary conductive layer 34a able to serve as a barrier layer at the thick wiring portion 40, it is necessary to make the pillar connection portion 36b and/or the bottom conductive layer 32b a multilayer structure including a barrier layer.

Figure 7A:
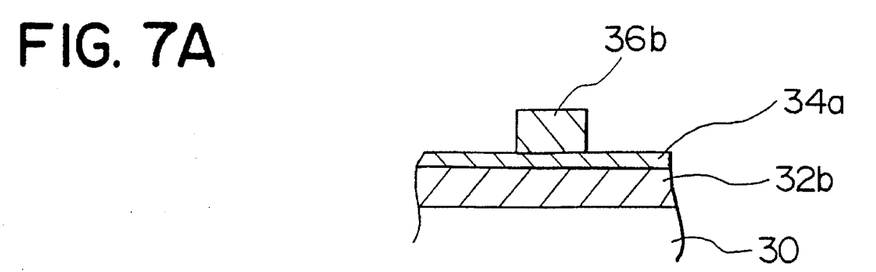
FIGS. 7A to 7D are sectional views of key portions showing a process for production after formation of the pillar connection portion on the bottom conductive layer and are sections along line VII—VII in FIG. 6H.
Figure 7B:
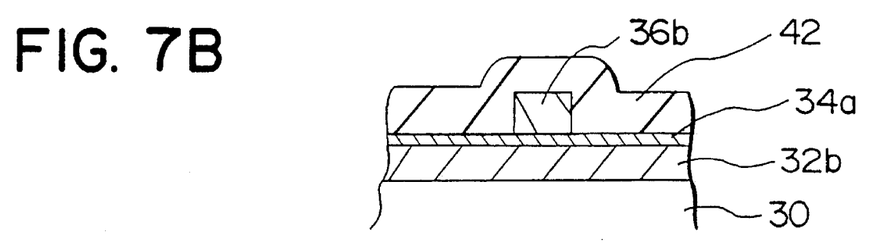

After forming the pillar connection portion 36b on the bottom conductive layer 32b, as shown in FIG. 7A and 7B, an interlayer insulating layer 42 is formed on its surface. The interlayer insulating layer 42 is not particularly limited, but may be comprised of silicon oxide, silicon nitride, a PSG film, a BPSG film, etc. formed by the CVD method.

Figure 7C:
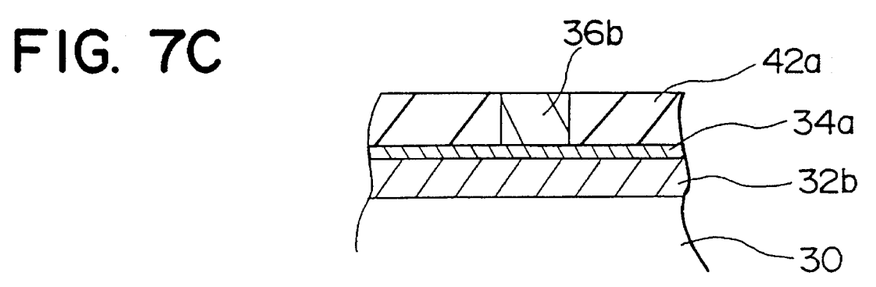
Figure 7D:
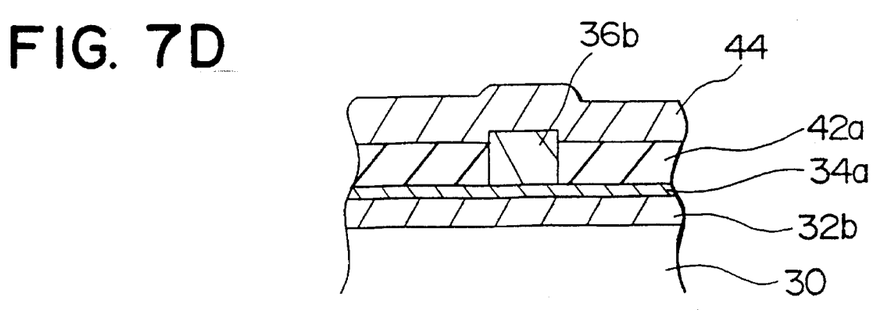

After this, as shown in FIG. 7C, the projections on the surface of the interlayer insulating layer 42 are selectively removed by the etching method or polishing or other means to flatten the surface and expose the top of the pillar connection portion 36b. Then, as shown in FIG. 7D, a top conductive layer 44 is formed on the flattened interlayer insulating layer 42a and the top conductive layer 44 and the bottom conductive layer 32b are electrically connected through the pillar connection portion 36b.

Note that the present invention is not limited to the above embodiments and can be modified in various ways within the scope of the invention.

As explained above, according to the present invention, since the bottom conductive layer has a pattern determined by the sum of the pattern of the auxiliary conductive layer formed on it and the pattern of the pillar connection portion, even if the bottom conductive layer and the pillar connection portion (contact portion) are miniaturized, it is possible to determine the area of the connection portion by self-alignment and therefore possible to prevent poor connections and improve the connection reliability.

I claim:

1. A semiconductor device multilayer wiring structure, comprising:

a bottom conductive layer on a substrate;

a top conductive layer;

an auxiliary conductive layer on the bottom conductive layer, and a pillar connection portion connected between the top conductive layer and the bottom conductive layer having at least a portion of the pillar connection portion formed over the auxiliary conductive layer, wherein the bottom conductive layer has a pattern determined by a sum of a pattern of the auxiliary conductive layer formed on the bottom conductive layer and a pattern of the pillar connection portion.

2. A semiconductor multilayer wiring structure according to claim 1, wherein said auxiliary conductive layer is comprised of a material which is different from a material forming the bottom conductive layer.

3. A semiconductor device multilayer wiring structure according to claim 2, wherein said bottom conductive layer is comprised of a conductor selected from the group consisting of aluminum alloy, copper alloy and polycrystalline silicon.

4. A semiconductor device multilayer wiring structure according to claim 2, wherein said auxiliary conductive layer is a film for preventing reflectance during patterning of said bottom conductive layer.

5. A semiconductor device multilayer wiring according to claim 2, wherein said auxiliary conductive layer is formed of a metal from the group consisting of titanium, titanium oxynitride, silicide, or a film of two or more superimposed layers of the same.

6. A semiconductor device multilayer wiring structure according to claim 4, wherein a thickness of the auxiliary conductive layer is from approximately 50 to approximately 100 nanometers.

7. A semiconductor device multilayer wiring structure comprising:

a bottom conductive layer;

an auxiliary conductive layer on the bottom conductive layer;

a pillar connection formed on a portion of the auxiliary conductive layer; and wherein a pattern of the bottom conductor layer is defined by a sum of a pattern of the auxiliary conductive layer and a pattern of the pillar connection.

* * * * *